United States Patent
Ichikawa

(10) Patent No.: US 8,717,073 B2
(45) Date of Patent: May 6, 2014

(54) DIGITAL PLL CIRCUIT AND CLOCK GENERATOR

(71) Applicant: Asahi Kasei Microdevices Corporation, Tokyo (JP)

(72) Inventor: Chiharu Ichikawa, Tokyo (JP)

(73) Assignee: Asahi Kasei Microdevices Corporation, Tokyo (JP)

( * ) Notice: Subject to any disclaimer, the term of this patent is extended or adjusted under 35 U.S.C. 154(b) by 0 days.

(21) Appl. No.: 13/772,531

(22) Filed: Feb. 21, 2013

(65) Prior Publication Data

US 2013/0222016 A1 Aug. 29, 2013

(30) Foreign Application Priority Data

Feb. 23, 2012 (JP) .................................. 2012-037665
Feb. 5, 2013 (JP) .................................. 2013-020585

(51) Int. Cl.
*H03L 7/06* (2006.01)

(52) U.S. Cl.
USPC .......................................... 327/156; 327/158

(58) Field of Classification Search
USPC .......... 327/141, 144–150, 155–163; 375/376, 375/394, 354, 327
See application file for complete search history.

(56) References Cited

U.S. PATENT DOCUMENTS

| | | | |
|---|---|---|---|
| 5,452,326 A | 9/1995 | Tanaka | |
| 7,151,814 B1 * | 12/2006 | Kong et al. | 375/376 |
| 7,616,066 B2 | 11/2009 | Ishii | |
| 7,664,217 B2 | 2/2010 | Nakamuta et al. | |
| 7,920,081 B2 * | 4/2011 | Waheed et al. | 341/118 |
| 2009/0167443 A1 | 7/2009 | Liu et al. | |
| 2010/0214029 A1 | 8/2010 | McDonald et al. | |

FOREIGN PATENT DOCUMENTS

| | | |
|---|---|---|
| JP | H05-235751 A | 9/1993 |
| JP | H10-173642 A | 6/1998 |
| JP | H11-261546 A | 9/1999 |
| JP | H11-308104 A | 11/1999 |
| JP | 2002-135237 A | 5/2002 |
| JP | 2006-217203 A | 8/2006 |
| JP | 2007-027981 A | 2/2007 |
| JP | 2009-212995 A | 9/2009 |

* cited by examiner

*Primary Examiner* — Lincoln Donovan
*Assistant Examiner* — Diana J Cheng
(74) *Attorney, Agent, or Firm* — Morgan, Lewis & Bockius LLP

(57) ABSTRACT

A circuit according to the present invention includes: an oscillator; a divider; a time-to-digital converter comparing the phase and frequency of a reference clock signal REF from the divider with an internal clock signal and outputting digital data D1 based on the comparison results; a digital loop filter receiving the D1 and outputting digital data W1; a data holder holding the W1 from the filter in time series manner; a switch selecting either digital data W2 from the holder or the W1 and outputting the selected data as digital data W3; a digitally controlled oscillator with oscillation frequency controlled based on the W3; and a data controller switching input data of the switch, and starting/halting the operation of the oscillator, the divider, the converter and the filter. Current consumption by the digital PLL circuit can be reduced.

8 Claims, 5 Drawing Sheets

DIGITAL PLL CIRCUIT AND CLOCK GENERATOR

CROSS-REFERENCES TO RELATED APPLICATIONS

This application claims the benefit of Japanese Patent Application Nos. 2012-037665, filed Feb. 23, 2012 and 2013-020585, filed Feb. 5, 2013, which are hereby incorporated by reference herein in their entirety.

BACKGROUND OF THE INVENTION

1. Field of the Invention

The present invention relates to a digital PLL circuit and to a clock generator wherein the digital PLL circuit is included, and relates in particular to a reduction in the current consumption by the digital PLL circuit.

2. Description of the Related Art

FIG. 1 is a diagram illustrating an example relevant to a reduction in the current consumption by a semiconductor apparatus that includes a digital PLL circuit. For the arrangement shown in FIG. 1, Japanese Patent Laid-Open No. 2002-135237, for example, should be referred to. While referring to FIG. 1, a switch is provided for the input/output unit of a digital PLL circuit, and to reduce the current consumption, the digital PLL circuit is isolated from the other circuits by using a SLEEP signal, or is halted when not in use.

Further, when only the current consumption by the digital PLL circuit is to be reduced, a technique is employed whereby a digital processing speed can be decreased. FIG. 2 is a diagram depicting an example of the use of the technique, for which Japanese Patent Laid-Open No. H05-235751 (1993), for example, should be referred to.

However, the arrangement disclosed in Japanese Patent Laid-Open No. 2002-135237 is employed for reducing current consumption for an entire device, and is not provided for reducing only the current consumption by a PLL circuit. Further, the technique described in Japanese Patent Laid-Open No. H05-235751(1993) relates to a digital signal processing PLL circuit that extracts a clock from digital audio data, for example, and that reduces the number of digital data operations to obtain a lower current consumption than the other conventional technique does. This method, therefore, is not satisfactory for the reduction of the current consumed by a PLL circuit alone.

SUMMARY OF THE INVENTION

While taking the above described problems into account, an object of the present invention is to provide a digital PLL circuit for which current consumption is reduced.

In accordance with an aspect of the present invention proposed by the present inventor in order to achieve the object, a digital PLL circuit is provided, which includes: a time to digital converter for comparing a reference clock signal with an internal clock signal and outputting a first digital data based on obtained comparison results; a digital loop filter for receiving the first digital data and outputting second digital data; a digital controlled oscillator, an oscillation frequency of which is controlled based on the second digital data; a data holder for holding the second digital data in a time series manner; and a data controller for controlling switching in order to selectively transmit either the second digital data held in the data holder in accordance with the time series or the second digital data from the digital loop filter to the digitally controlled oscillator.

Preferably, for the digital PLL circuit of the aspect, when the data controller selects the second digital data held by the data holder in the time series manner for transmission to the digitally controlled oscillator, the data controller halts at least either the time to digital converter or the digital loop filter. Furthermore, when the data controller selects the second digital data held by the data holder in the time series manner for transmission to the digitally controlled oscillator, the data holder iteratively outputs the second digital data held in the time series manner. Further, the data holder holds a differential data with respect to reference digital data that is employed as a standard as the second digital data to be held in the time series manner and adds the differential data to the reference digital data to output the resultant data.

In accordance with another aspect of the present invention, a clock generator including the digital PLL circuit of the above aspect is provided, which includes: an oscillator; and a frequency divider for dividing an output of the oscillator and outputting a reference clock signal, wherein, when the data controller selects the second digital data held by the data holder in the time series manner for transmission to the digitally controlled oscillator, the data controller halts at least one of the oscillator, the frequency divider, the time to digital converter and the digital loop filter.

In accordance with an additional aspect of the present invention, a clock generator including the digital PLL circuit of the above aspect is provided, which includes: an oscillator; and a frequency divider for dividing an output of the oscillator and outputting a reference clock signal, wherein, when the frequency divider is a fractional frequency divider, the data holder holds the second digital data in the time series manner for a time period obtained by multiplying the period of the frequency divider.

In accordance with a further aspect of the present invention, a clock generator including the digital PLL circuit of the above aspect is provided, which includes: an oscillator; and a frequency divider for dividing an output of the oscillator and outputting a reference clock signal, wherein, when the data controller switches data to be transmitted to the digitally controlled oscillator from the second digital data held by the data holder in the time series manner to the second digital data from the data loop filter, the switching is performed in synchronization with the internal clock signal.

In accordance with yet one more aspect of the present invention, a digital PLL circuit is provided, which includes: a time to digital converter for comparing a reference clock signal with an internal clock signal and outputting a first digital data based on obtained comparison results; a digital loop filter for receiving the first digital data and outputting second digital data; a digitally controlled oscillator, an oscillation frequency of which is controlled based on the second digital data; a data holder for holding a third digital data from a proportional coefficient multiplier included in the digital loop filter in a time series manner; and a data controller for controlling switching in order to selectively transmit either the third digital data held in the data holder in accordance with the time series or the third digital data from the proportional coefficient multiplier to the digitally controlled oscillator.

Preferably, for the digital PLL circuit of the above aspect, the data holder holds differential data with respect to reference digital data that is employed as a standard as the third digital data to be held in the time series manner and adds the differential data to the reference digital data to output the resultant data.

According to the digital PLL circuit and the clock generator described in the individual aspects of the present invention, low consumption of current can be achieved, without deterioration of frequency accuracy.

DESCRIPTION OF THE EMBODIMENTS

Figure 1:
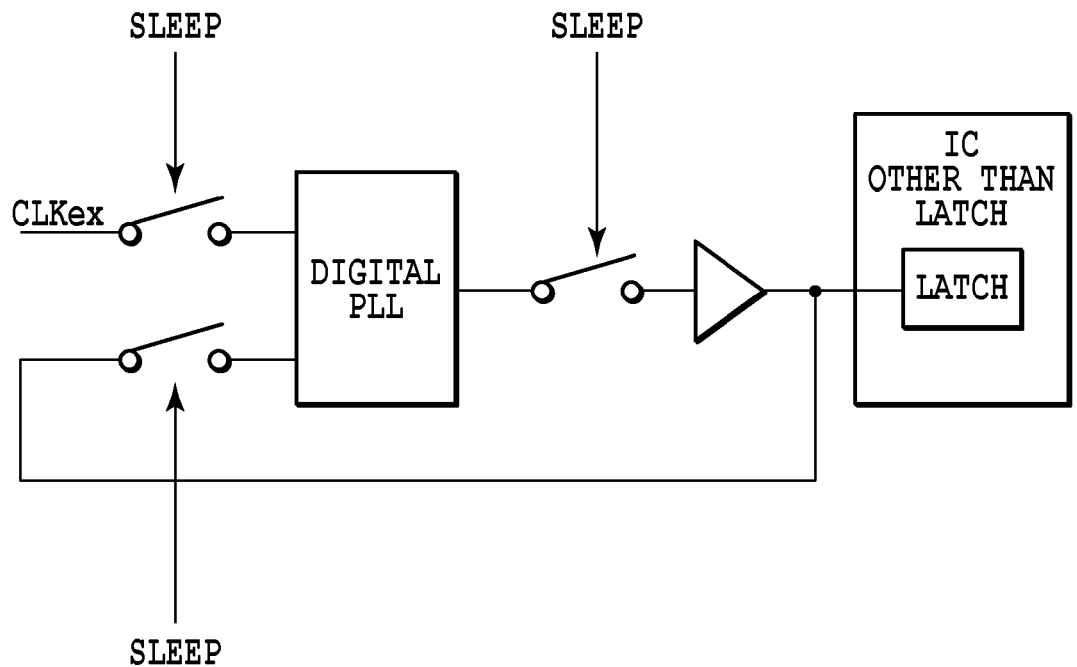
FIG. 1 is a block diagram illustrating one conventional example related to the reducing of current consumption for a semiconductor apparatus that includes a digital PLL circuit.
Figure 2:
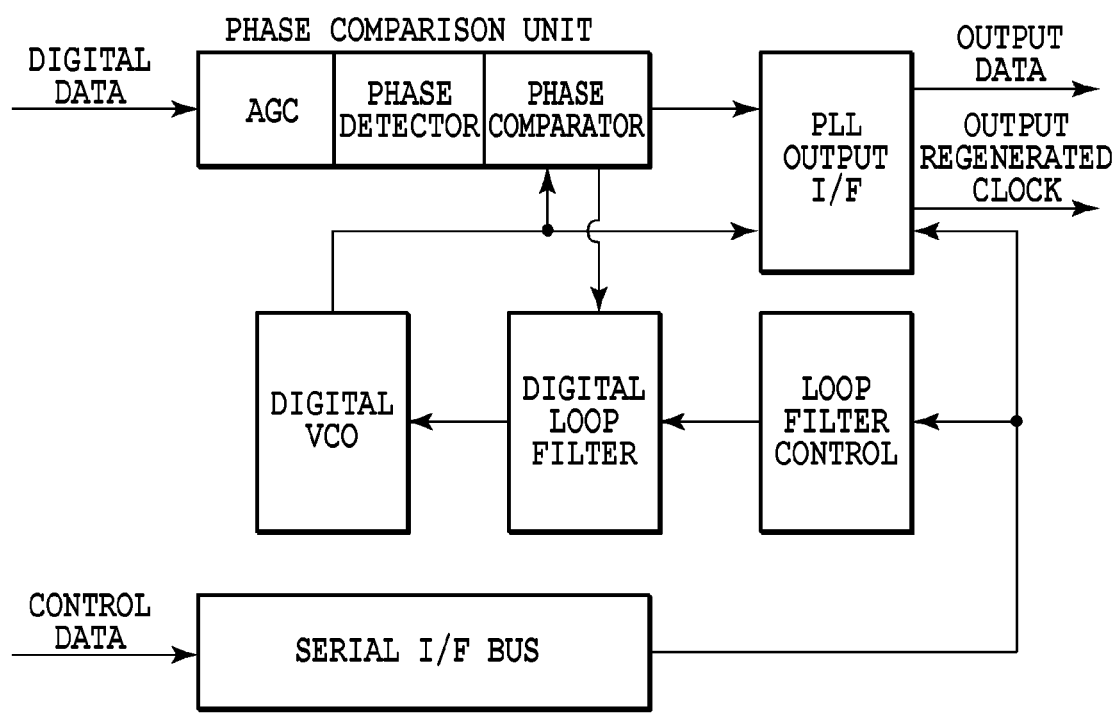
FIG. 2 is a block diagram illustrating another conventional example related to the reducing of current consumption of a semiconductor apparatus that includes a digital PLL circuit.
Figure 3:
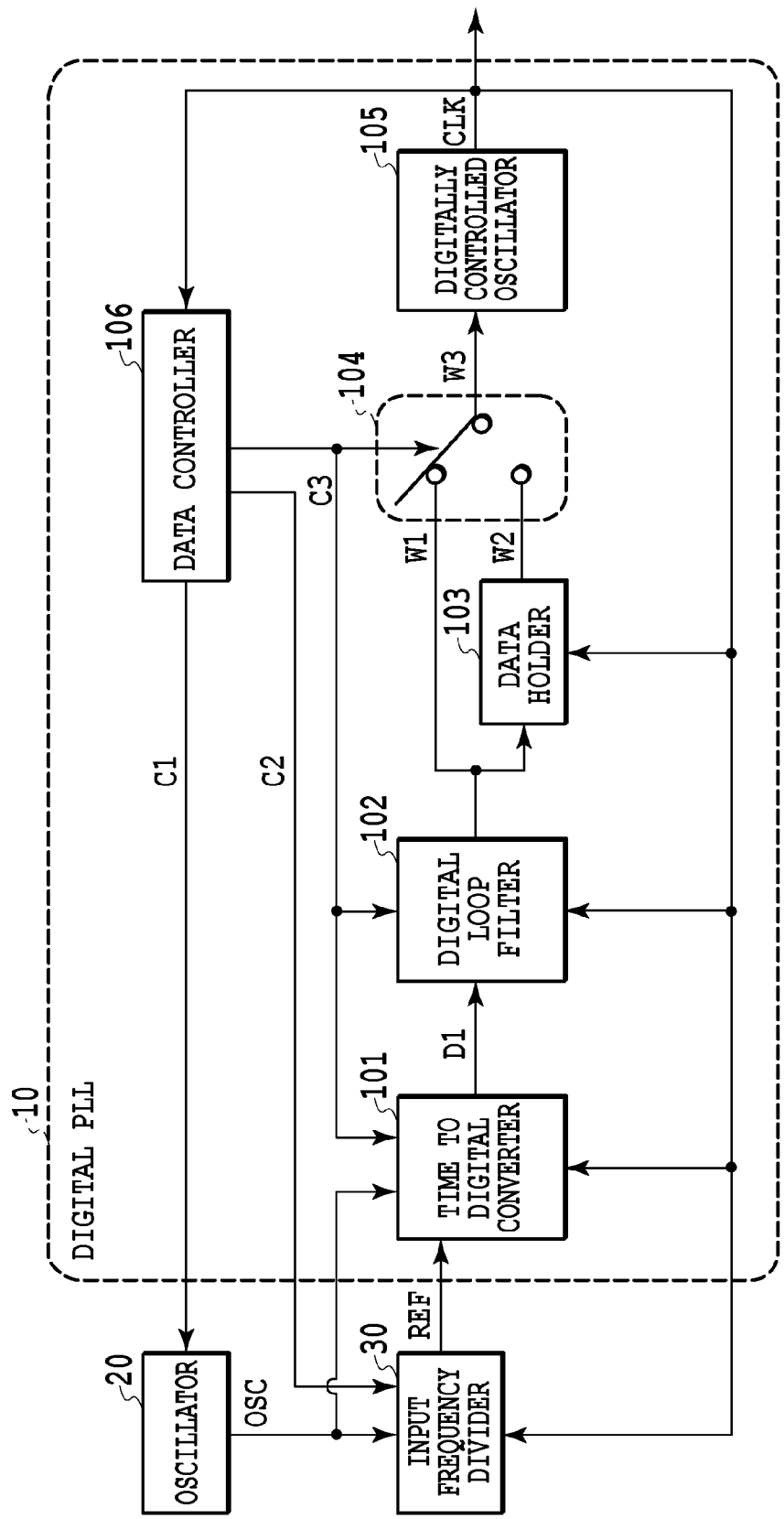
FIG. 3 is a block diagram showing the arrangement of a clock generator that includes a digital PLL circuit according to one embodiment of the present invention.

FIG. 3 is a block diagram illustrating an example arrangement for a clock generator that includes a digital PLL circuit 10 according to one embodiment of the present invention.

The clock generator in FIG. 3 includes an oscillator 20; an input frequency divider 30; a time to digital converter 101, which compares the phase and frequency of a reference clock REF output from the input frequency divider 30 with those of an internal clock signal CLK to output digital data D1 based on the comparison results; a digital loop filter 102 which removes high frequency noise from the digital data D1 received from the time to digital converter 101; a data holder 103 which holds, in a time series manner, digital data W1 output by the digital loop filter 102; a data selection switch 104 which is employed to select either digital data W2 output by the data holder 103 or the digital data W1 to output the selected data as digital data W3; a digitally controlled oscillator 105 for which the oscillation frequency is controlled based on the digital data W3; and a data controller 106 which controls to change the data selection switch 104 to select data to be transmitted and controls to start/halt the operations of the oscillator 20, the input frequency divider 30, the time to digital converter 101 and the digital loop filter 102. It should be noted that the internal clock signal CLK is a clock signal output by the digitally controlled oscillator 105.

To provide a more specific explanation, assume that the oscillator 20 generates a clock signal OSC having a frequency of 38.4 MHz and the digitally controlled oscillator 105 generates the internal clock signal CLK having a frequency of 32.768 KHz (real time clock). Further, the input frequency divider 30 is a fractional frequency divider that divides a frequency by 1171 at first, and then divides a frequency by 1172 seven times in a row, i.e., and repeats the eight sequential frequency divisions. At this time, expression (1) below is established.

$$REF = 38.4 \text{ MHz}/((1171 \times 1 + 1172 \times 7)/8) \quad (1)$$
$$= 32.768 \text{ KHz} = CLK$$

Based on the expression, the period of the input frequency divider 30 has a length of eight clock signals of 32.768 KHz, and the time length consisting of eight times the phase comparison performed by the time to digital converter 101 is equivalent to the period.

Further, the time to digital converter 101 compares the phases between the reference clock signal REF and the internal clock signal CLK. The obtained phase difference is counted using a clock signal OSC, and is output as digital data D1.

Figure 4:
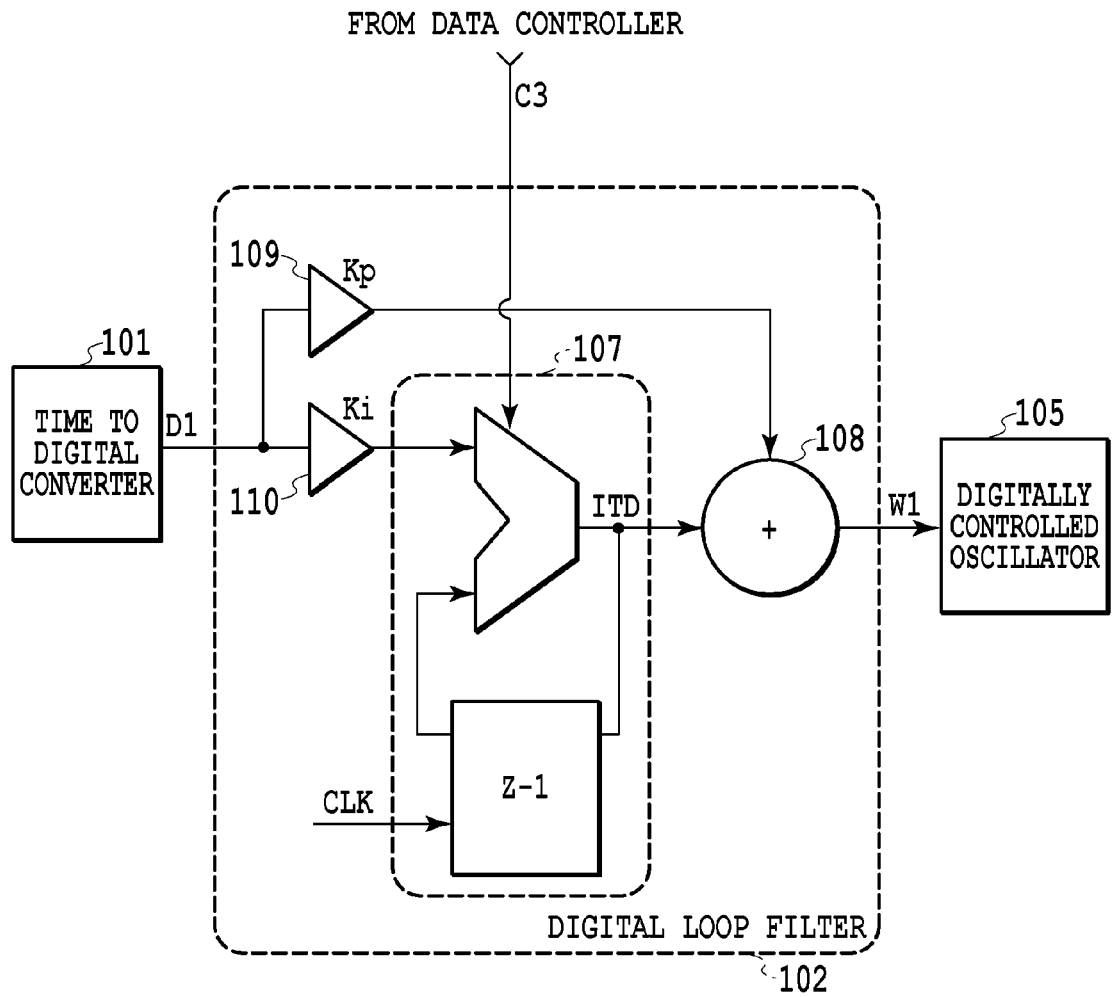
FIG. 4 is a detailed block diagram showing an example arrangement for a digital loop filter in FIG. 3.

The digital data D1 is transmitted to the digital loop filter 102. FIG. 4 is a more detailed diagram showing an example arrangement of the digital loop filter 102. The digital data filter 102 includes an accumulator 107, an adder 108, a proportional coefficient (Kp) multiplier 109, and an integral coefficient (Ki) multiplier 110. When the input data for the digital loop filter 102 is D1 and the output data is W1, and the output data of the accumulator 107 is ITD, a relationship of the data D1 and W1 is represented by expression (2) using a Z function $Z^{-1}$.

$$W1 = Kp \times D1 + Z^{-1} ITD + Ki \times D1 \quad (2)$$

When the data controller 106 controls the data selection switch 104 and selects the data W1 to be output to the digitally controlled oscillator 105, W3=W1 is established. Therefore, the digitally controlled oscillator 105 is controlled based on the data W1 output by the digital loop filter 102, and is employed as a normal digital PLL.

Further, the data W1 output by the digital loop filter 102 is also transmitted to the data holder 103, which is synchronized with the internal clock signal CLK to receive the data W1. As a data fetching method, differential data with respect to reference digital data that is employed as a standard may be stored. Furthermore, when the data holder 103 outputs data, the reference digital data and the differential data are added and the resultant data are output. The data holder 103 holds, in a time series manner, the amount of data W1 for a phase comparison performed 16 times by the time to digital converter 101 (twice that of the period frame). Further, data held by the data holder 103 is always updated during the normal digital PLL operation.

Next, in a case wherein the data controller 106 controls the data selection switch 104 and selects the data W2 to be output to the digitally controlled oscillator 105, W3=W2 is established. Therefore, the digitally controlled oscillator 105 is controlled based on the data W2 output by the data holder 103. The latest data W1 output by the digital loop filter 102 for the 16 performances are held in the time series in the data holder 103, and the held data are iteratively output as the data W2. Furthermore, at this time, the oscillator 20 is halted based on a signal C1 output by the data controller 106. Similarly, the time to digital converter 101 and the digital loop filter 102 are halted based on a signal C3 output by the data controller 106. That is, when the data W2 is supplied to the digitally controlled oscillator 105, only the data holder 103 and the digitally controlled oscillator 105 are operated.

In the embodiment, data held by the data holder 103 is data for 16 performances of phase comparison performed by the time to digital converter 101, i.e., data for a double of the period of the input frequency divider 30. When the data holder 103 holds data in the time series manner and iteratively employs the data as the data W2, data is averaged for all repetitive periods and the oscillator can be controlled at an accuracy equal to or lower than a quantization error included in the digital data. Thus, the frequency accuracy of the internal clock signal CLK can be improved. Further, when the fractional frequency divider 30 performs fractional frequency division, the period for data held by the data holder 103 is set as a time length obtained by multiplying the period for fractional frequency division and thereby the frequency accuracy can be improved without being affected by the periodic changing of the frequency. Further, since only the data holder 103 and the digitally controlled oscillator 105 are operated when the data W2 is employed, current consumption can be minimized.

Meanwhile, in a case where the data W1 is selected again to be transmitted to the digitally controlled oscillator 105, the oscillator 20 begins oscillation based on a control signal C1 output by the data controller 106.

Then, the input frequency divider 30 employs a control signal C2 as a trigger, and begins fractional frequency division in synchronization with the leading edge of the internal clock signal CLK. Due to the division of an input frequency in synchronization with the leading edge of the internal clock signal CLK, the phase of the reference clock signal REF can be aligned with that of the internal clock signal CLK. As a result, frequency fluctuations caused by unnecessary frequency acquisition can be reduced. Further, when the frequency of the reference clock signal REF is the same as the frequency of the internal clock signal CLK, the digital PLL circuit 10 can be substantially locked at the start of the input frequency division.

Following this, the time to digital converter 101 and the digital loop filter 102 employ the control signal C3 as a trigger, and begin the operation in synchronization with the internal clock signal CLK. When phase comparison between the reference clock signal REF and the internal clock signal CLK is started in synchronization with the internal clock signal CLK, an accurate operation is ensured.

As described above, since the normal digital PLL operating mode and the mode for operating only the data holder 103 and the digitally controlled oscillator 105 are employed together according to the circuit of the present invention, current consumption can be greatly reduced.

As a specific operation example, assume that the normal digital PLL operation is to be performed, once every second, for a period of ten milliseconds, and only the data holder 103 and the digitally controlled oscillator 105 are to be operated in the remaining time. Current consumption during the normal digital PLL operation is about 1 mA, for which the oscillator 20, the input frequency divider 30 and the time to digital converter 101 are dominant or main. This is because the operating speed is high, i.e., 38.4 MHz. Current consumption in the mode for operating only the data holder 103 and the digitally controlled oscillator 105 is several µA. This is because the operating speed is low, i.e., 32.768 KHz. The time required for the normal digital PLL operation is 10 milliseconds, once every second, and since this operating time is 1/100 of the total of the operating periods for the two modes, the average current consumption is about 10 µA. When it is taken into account that the data holder 103 and the digitally controlled oscillator 105 are always operated, the total current consumption is about 12 µA to 13 µA.

As an alternative control method, the period for the normal digital PLL operation can be changed, for example, to two seconds or four seconds. Further, the operating time for one repetition can be shorter than 10 milliseconds. Moreover, the normal digital PLL operation need not always be performed in accordance with the period frame, but may be performed at the time of a detection of a temperature change or a power voltage change.

Figure 5:
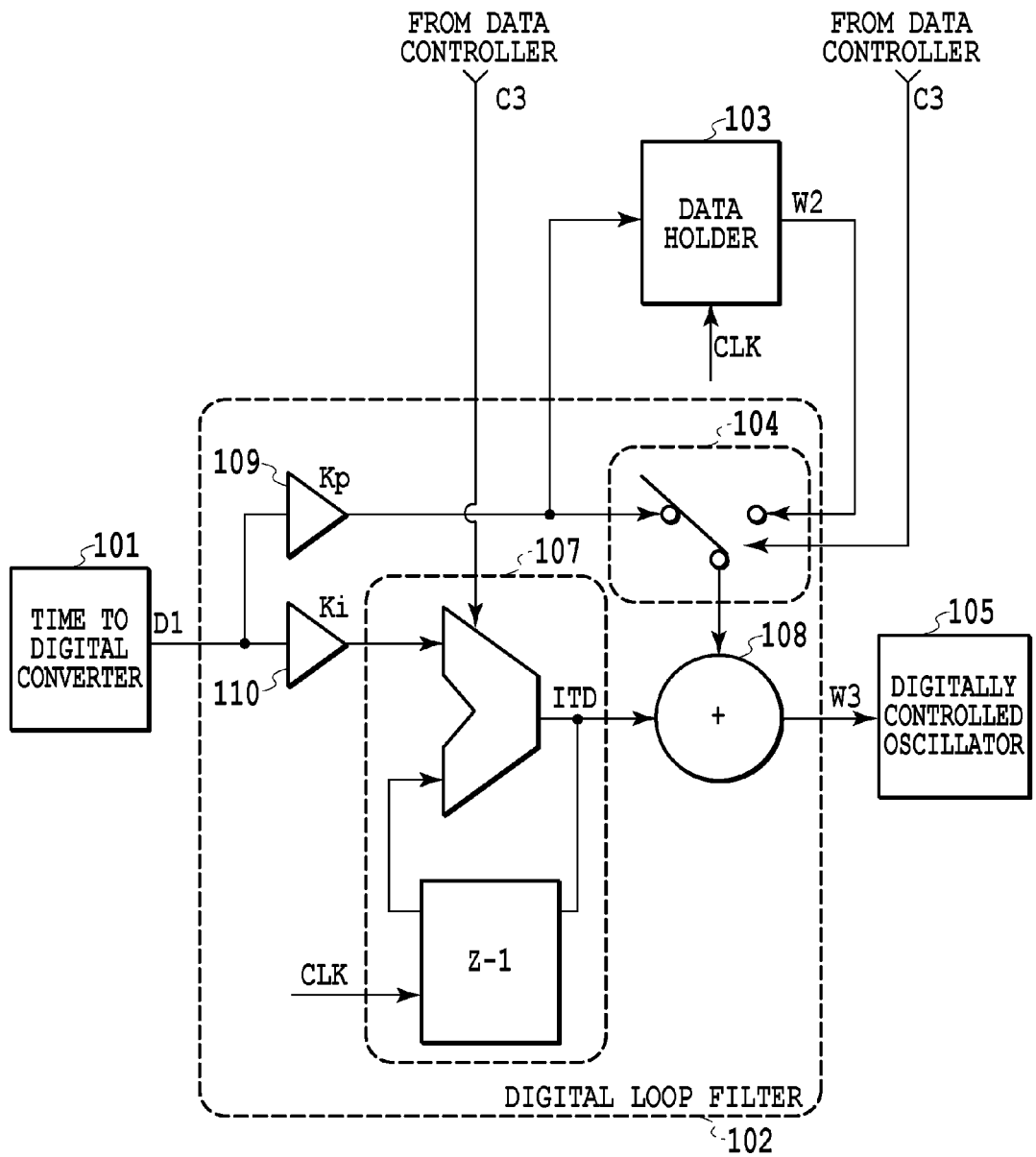
FIG. 5 is a block diagram illustrating the arrangement of a clock generator according to another embodiment of the present invention.

Further, though the digital loop filter 102, the data holder 103 and the data selection switch 104 are provided as separate units and are connected in series in the above, the arrangement shown in FIG. 5 may also be employed. When the digital loop filter 102 shown in FIG. 5 that includes the data selection switch 104 is employed, the accumulator 107 is halted based on a signal C3 output by the data controller 106, and thus the data ITD can be employed as reference digital data that is employed as a standard.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. A digital PLL circuit comprising:
   a time to digital converter for comparing a reference clock signal with an internal clock signal and outputting a first digital data based on obtained comparison results;
   a digital loop filter for receiving the first digital data and outputting second digital data;
   a digitally controlled oscillator, an oscillation frequency of which is controlled based on the second digital data;
   a data holder for holding the second digital data in a time series manner; and
   a data controller for controlling switching in order to selectively transmit either the second digital data held in the data holder in accordance with the time series or the second digital data from the digital loop filter to the digitally controlled oscillator
   wherein, when the data controller selects the second digital data held by the data holder in the time series manner for transmission to the digitally controlled oscillator, the data controller halts at least either the time to digital converter or the digital loop filter.

2. The digital PLL circuit according to claim 1, wherein, when the data controller selects the second digital data held by the data holder in the time series manner for transmission to the digitally controlled oscillator, the data holder iteratively outputs the second digital data held in the time series manner.

3. The digital PLL circuit according to claim 1, wherein the data holder holds a differential data with respect to reference digital data that is employed as a standard as the second digital data to be held in the time series manner and adds the differential data to the reference digital data to output the resultant data.

4. A clock generator including the digital PLL circuit according to claim 1, comprising:
   an oscillator; and
   a frequency divider for dividing an output of the oscillator and outputting a reference clock signal,
   wherein, when the data controller switches data to be transmitted to the digitally controlled oscillator from the second digital data held by the data holder in the time series manner to the second digital data from the data loop filter, the switching is performed in synchronization with the internal clock signal.

5. A clock generator comprising:
   a digital PLL circuit;
   an oscillator; and
   a frequency divider for dividing an output of the oscillator and outputting a reference clock signal,
   wherein the digital PLL circuit comprising:
   a time to digital converter for comparing a reference clock signal with an internal clock signal and outputting a first digital data based on obtained comparison results;
   a digital loop filter for receiving the first digital data and outputting second digital data;
   a digitally controlled oscillator, an oscillation frequency of which is controlled based on the second digital data;
   a data holder for holding the second digital data in a time series manner; and a data controller for controlling switching in order to selectively transmit either the second digital data held in the data holder in accordance with the time series or the second digital data from the digital loop filter to the digitally controlled oscillator wherein, when the data controller selects the second digital data held by the data holder in the time series manner for transmission to the digitally controlled oscillator, the data controller halts at least one of the oscillator, the frequency divider, the time to digital converter and the digital loop filter.

6. A clock generator comprising:

a digital PLL circuit;

an oscillator; and a frequency divider for dividing an output of the oscillator and outputting a reference clock signal, wherein the digital PLL circuit comprising:

a time to digital converter for comparing a reference clock signal with an internal clock signal and outputting a first digital data based on obtained comparison results;

a digital loop filter for receiving the first digital data and outputting second digital data;

a digitally controlled oscillator, an oscillation frequency of which is controlled based on the second digital data;

a data holder for holding the second digital data in a time series manner; and a data controller for controlling switching in order to selectively transmit either the second digital data held in the data holder in accordance with the time series or the second digital data from the digital loop filter to the digitally controlled oscillator wherein, when the frequency divider is a fractional frequency divider, the data holder holds the second digital data in the time series manner for a time period obtained by multiplying the period of the frequency divider.

7. A digital PLL circuit comprising:

a time to digital converter for comparing a reference clock signal with an internal clock signal and outputting a first digital data based on obtained comparison results;

a digital loop filter for receiving the first digital data and outputting second digital data;

a digitally controlled oscillator, an oscillation frequency of which is controlled based on the second digital data;

a data holder for holding a third digital data from a proportional coefficient multiplier included in the digital loop filter in a time series manner; and a data controller for controlling switching in order to selectively transmit either the third digital data held in the data holder in accordance with the time series or the third digital data from the proportional coefficient multiplier to the digitally controlled oscillator wherein, when the data controller selects the second digital data held by the data holder in the time series manner for transmission to the digitally controlled oscillator, the data controller halts at least either the time to digital converter or the digital loop filter.

8. The digital PLL circuit according to claim 7, wherein the data holder holds differential data with respect to reference digital data that is employed as a standard as the third digital data to be held in the time series manner and adds the differential data to the reference digital data to output the resultant data.

* * * * *